United States Patent [19]

Shibata

[11] Patent Number: 5,404,325
[45] Date of Patent: Apr. 4, 1995

[54] DYNAMIC RANDOM ACCESS MEMORY DEVICE WITH PRECHARGING UNIT PREVENTING COUNTER ELECTRODES OF STORAGE CAPACITORS FROM VOLTAGE FLUCTUATION

[75] Inventor: Kazuo Shibata, Tokyo, Japan

[73] Assignee: NEC Corporation, Tokyo, Japan

[21] Appl. No.: 74,406

[22] Filed: Jun. 10, 1993

[30] Foreign Application Priority Data

Jun. 10, 1992 [JP] Japan .................... 4-150205

[51] Int. Cl.[6] .......................................... G11C 11/24
[52] U.S. Cl. .......................... 365/149; 365/189.09; 365/203; 365/233; 365/194; 365/227; 365/228
[58] Field of Search .................. 365/149, 189.09, 203, 365/233, 194, 226, 227, 228, 189.11

[56] References Cited

U.S. PATENT DOCUMENTS

| | | | |
|---|---|---|---|
| 4,458,336 | 7/1984 | Takemae | 365/149 |
| 4,578,776 | 3/1986 | Takemae et al. | 365/149 |
| 4,941,128 | 7/1990 | Wada et al. | 365/203 |
| 4,943,952 | 7/1990 | Terayama | 365/207 |
| 5,146,110 | 9/1992 | Kim et al. | 307/296.2 |
| 5,235,550 | 8/1993 | Zagar | 365/226 |
| 5,253,205 | 10/1993 | Eaton, Jr. | 365/189.06 |
| 5,255,232 | 10/1993 | Foss et al. | 365/203 |

FOREIGN PATENT DOCUMENTS 151898  8/1985  European Pat. Off. ............ 365/149

Primary Examiner—Eugene R. LaRoche
Assistant Examiner—Andrew Q. Tran
Attorney, Agent, or Firm—Sughrue, Mion, Zinn, Macpeak & Seas

[57] ABSTRACT

An intermediate voltage generator incorporated in a dynamic random memory device is shared between digit lines and counter electrodes of storage capacitors forming parts of memory cells, and supplies an intermediate voltage through precharging transistors to digit lines already shifted to high low voltage levels and directly to the counter electrodes, wherein a switching transistor cuts off the voltage propagation path between the intermediate voltage generator and the precharging transistors in the precharging stage so that the storage capacitors are free from voltage fluctuation due to the precharging operation on the digit lines.

6 Claims, 3 Drawing Sheets

DYNAMIC RANDOM ACCESS MEMORY DEVICE WITH PRECHARGING UNIT PREVENTING COUNTER ELECTRODES OF STORAGE CAPACITORS FROM VOLTAGE FLUCTUATION

FIELD OF THE INVENTION

This invention relates to a dynamic random access memory device and, more particularly, to a dynamic random access memory device having a precharging unit shared between digit lines and counter electrodes of storage capacitors.

DESCRIPTION OF THE RELATED ART

An essential part of a dynamic random access memory device is illustrated in FIG. 1 of the drawings, and FIG. 1 shows a row of memory cells MC1 to MCx associated with a word line WL only. However, the prior art dynamic random access memory device contains a large number of memory cells arranged in a matrix.

Each of the memory cells MC1 to MCx is implemented by a series combination of an n-channel enhancement type switching transistor Qn1 and a storage capacitor SC1, and data bits are stored in the storage capacitors SC1 in the form of electric charges.

A plurality of digit lines DL1a, DL1b, DLxa and DLxb are associated with the memory cells MC1 to MCx, and the digit lines DL1and DLxa are respectively paired with the digit lines DL1and DLxb, respectively. The combinations of digit lines DL1a/DL1b and DLxa/DLxb are hereinbelow referred to as "digit line pairs". The drain nodes of the n-channel enhancement type switching transistors MC1 to MCx incorporated in the memory cells MC1 to MCx are respectively coupled with the digit lines DL1b and DLxb, and the gate electrodes are commonly coupled with the word line WL. Though not shown in FIG. 1, the word line WL is driven by a row address decoder/word line driver unit when row address bits are indicative of a row address assigned to the word line WL.

The digit line pairs are coupled between an array of sense amplifier circuits SA1 to SAx and a precharging unit 1, and the precharging unit 1 comprises a plurality of precharging-and-balancing circuits 11 to 1x. Each of the precharging-and-balancing circuits 11 to 1x has two n-channel enhancement type charging transistors Qn21/Qn31 or Qn2x/Qn3x and an n-channel enhancement type balancing transistor Qn41 r Qn4x. The n-channel enhancement type charging transistors Qn21, Qn31, Qn2x and Qn3x are coupled between the digit lines DL1a, DL1b, DLxa and DLxb and an intermediate voltage line 2, and a precharge control signal line 3 is coupled with the gate electrodes of the n-channel enhancement type charging/balancing transistors Qn21 to Qn4x.

The intermediate voltage line 2 is further coupled with the counter electrodes of the storage capacitors SC1, and an intermediate voltage generator 4 supplies an intermediate voltage level Vcc/2 to the intermediate voltage line 2. The intermediate voltage generator 4 produces the intermediate voltage level Vcc/2 from a positive power voltage level Vcc, and the intermediate voltage level Vcc/2 is regulated to a half of the potential difference between the positive power voltage level Vcc and the ground voltage level.

The electric charges stored in each storage capacitor SC1 produce a potential difference between the associated digit line pair DL1a and DL1b or DLxa and DLxb in a read-out operation, and a write-in data bit is provided on one of the digit line pair as a potential difference. The potential difference on one of the digit line pairs is developed by the associated sense amplifier circuit SA1 or SAx, and the digit lines DL1a and DL1b or DLxa and DLxb selectively goes up and down to a high voltage level VH and a low voltage level VL.

Though not shown in the drawings, one of the sense amplifier circuits SA1 to SAx is coupled through a column selector with a data bus which in turn is coupled with an input/output data buffer circuit.

The prior art dynamic random access memory device thus arranged selectively enters a write-in mode and a read-out mode of operation. However, the precharging unit 1 behaves similarly in both read-out and write-in operations, and, for this reason, the digit line pairs DL1a/DL1b and DLxa/DLxb vary as shown in FIG. 2. In FIG. 2, N1, N2 and N3 are indicative of the output node of the intermediate volume generator 4, the source nodes of the n-channel enhancement type charging transistors Qn31 and Qn3x and the counter electrodes of the storage capacitors SC1, respectively The digit lines DL1a and DLxa have been lifted to the high voltage level VH, and the digit lines DL1b and DLxb have been decayed to the low voltage level VL before entry into a new write-in or read-out cycle. If a precharge control signal CLp is changed from the ground voltage level GND toward the positive power voltage level Vcc at time t1, the n-channel enhancement type charging transistors Qn21, Qn31, Qn2x and Qn3x and the n-channel enhancement type balancing transistors Qn41 and Qn4x gradually increase the channel conductances thereof, and current flows from the intermediate voltage line 2 through the n-channel enhancement type charging transistors Qn21, Qn31, Qn2x and Qn3x to the digit lines DL1, DL1b, DLxa and DLxb, respectively. However, the n-channel enhancement type charging transistors Qn31 and Qn3x turn on earlier than the n-channel enhancement type charging transistors Qn21 and Qn2x, because the low voltage level VL on the digit lines DL1b and DL allow the n-channel enhancement type charging transistors Qn31 and Qn3x to exceed the threshold earlier than the n-channel enhancement type charging transistors Qn21 and Qn2x. As a result, the digit lines DL1b and DLxb start decaying at time t2, and not only the nodes N1 and N2 but also the counter electrodes N3 immediately follow the digit lines DL1b and DLxb. The digit lines DL1a and DLxa start decaying at time t3. The intermediate voltage generator 4 supplies current to the intermediate voltage line 2, and the nodes N1 and N2 and the counter electrodes N3 is recovered to the intermediate voltage level Vcc/2 at time t4.

After time t4, the word line WL is driven to the power voltage level Vcc, and the storage capacitors SC1 are coupled with the digit lines DL1b and DLxb, respectively.

However, a problem is encountered in the prior art dynamic random access memory device in that the data bits stored in the storage capacitors SC1 tend to be destroyed. Another problem is a large amount of electric power consumed by the intermediate voltage generator 4.

SUMMARY OF THE INVENTION

It is therefore an important object of the present invention to provide a dynamic random access memory device which is reliable and small in electric power consumption.

The present inventor discovered that the undesirable voltage fluctuation on the counter electrodes N3 was causative of the data destruction as well as of the large amount of electric power consumption.

To accomplish the object, the present invention proposes to prevent counter electrodes from voltage fluctuation on a common voltage line.

In accordance with the present invention, there is provided a dynamic random access memory device comprising: a) a plurality of memory cells respectively storing data bits in the form of electric charges, and each implemented by a first switching transistor and a storage capacitor coupled in series; b) an addressing system responsive to external address bits for allowing the plurality of memory cells to selectively become accessible; c) a plurality of digit lines selectively coupled with drain nodes of the first switching transistors, and forming digit line pairs for propagating data bits in the form of a potential difference; d) an intermediate voltage generator operative to produce an intermediate voltage between a high voltage level and a low voltage level, and supplying the intermediate voltage through a common voltage line to a counter electrode of each storage capacitor; e) a precharging unit having a plurality of precharging transistors respectively coupled with the plurality of digit lines, and simultaneously turning on for transferring the intermediate voltage from the common voltage line to the digit lines in a precharging stage before the addressing system allows the plurality of memory cells to selectively become accessible; and f) a cut-off means coupled between the common voltage line and the precharging transistors for preventing the common voltage line from voltage fluctuation due to the precharging state.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENT

Figure 1:
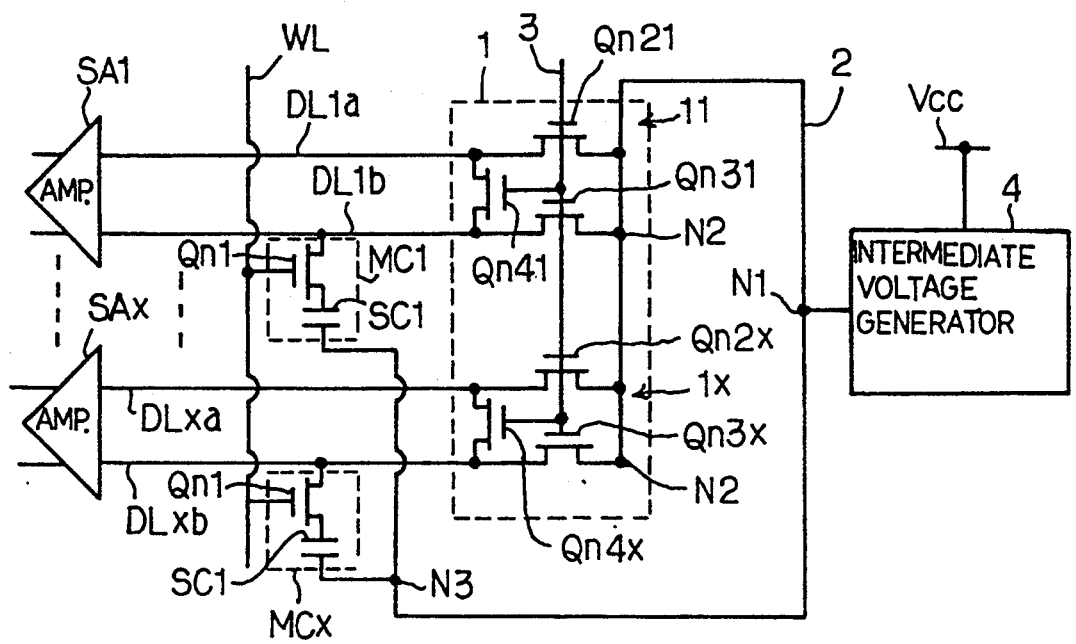
FIG. 1 is a circuit diagram showing the arrangement of the prior art dynamic random access memory device.
Figure 2:
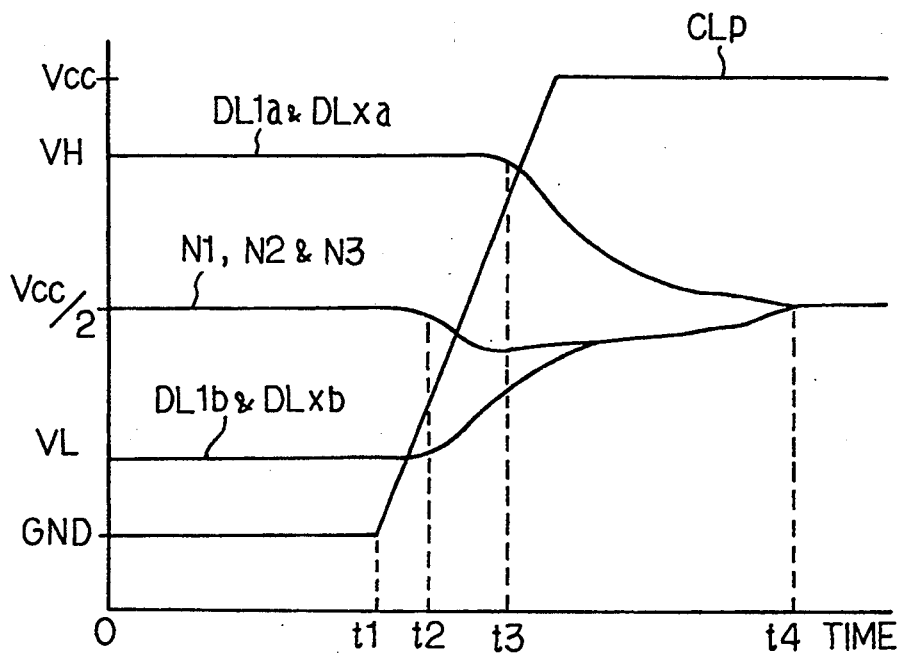
FIG. 2 is a diagram showing the waveforms on the digit lines, the intermediate voltage line and the counter electrodes after the entry into the new cycle.
Figure 3:
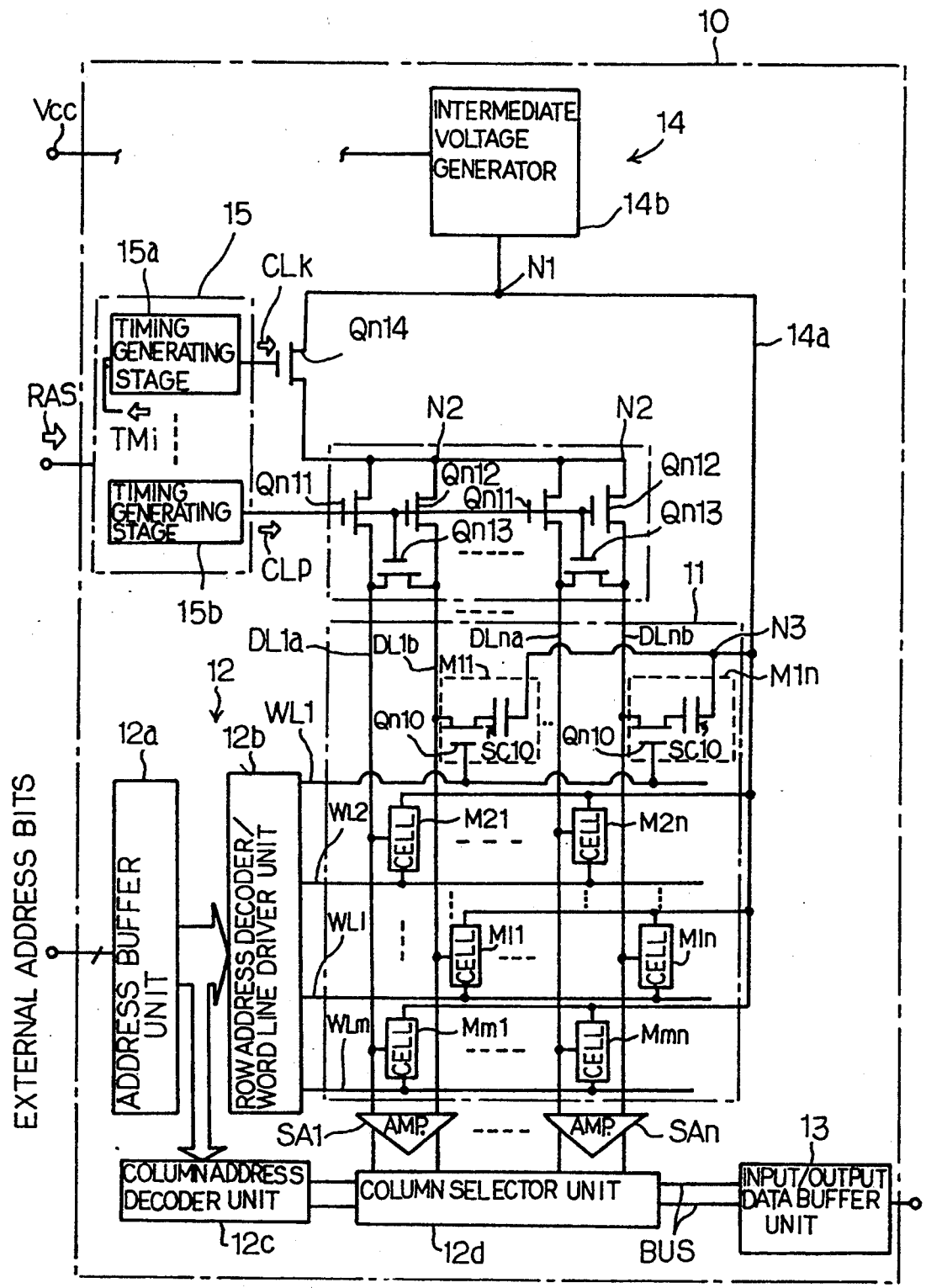
FIG. 3 is a circuit diagram showing a dynamic random access memory device according to the present invention.

Referring to FIG. 3 of the drawings, a dynamic random access memory device embodying the present invention is fabricated on a single semiconductor chip 10, and largely comprises a memory cell array 11, an addressing system 12, a plurality of digit line pairs DL1a/DL1b to DLna/DLnb, an array of sense amplifier circuits SA1 to SAn, an input/output data buffer unit 13, a precharging system 14 and a timing controlling unit 15. Although the dynamic random access memory device further contains components blocks, they are not shown in FIG. 3, because they are less important for understanding the present invention.

The memory cell array 11 is implemented by a plurality of memory cells M11, M1n, M21, M2n, M11, M1n, Mm1 and Mmn arranged in rows and columns, and the bit line pairs DL1a/DL1b to DLna/DLnb are respectively associated with the of memory cells M11 to Mmn. Each of the memory cells M11 to Mmn is implemented by a series combination of n-channel enhancement type switching transistor Qn10 and a storage capacitor SC10, and the drain nodes of the channel enhancement type switching transistors Qn10 are selectively coupled with the digit lines DL1a to DLnb. The source nodes of the n-channel enhancement type switching transistors Qn10 are coupled with the accumulating electrodes of the associated storage capacitors SC10, and a common voltage line 14a forming part of the precharging system 14. Data bits are stored the storage capacitors SC10 in the form of electric charges, and produce potential differences on the associated digit line pairs DL1a/DL1b to DLna/DLnb, respectively. Column addresses are respectively assigned to the columns of memory cells M11 to Mmn and, accordingly, to the digit line pairs DL1a/DL1b to DLna/DLnb.

The digit line pairs DL1a/DL1b to DLna/DLnb are terminated at the sense amplifier circuits SA1 to SAn, and the sense amplifier circuits SA1 to SAn develop the potential differences on the digit line pairs DL1a/DL1b to DLna/DLnb.

The addressing system 12 comprises an address buffer unit 12a, the row address decoder/word line driver unit 12b, word lines WL1 to WLm, a column address decoder unit 12c, and a column selector unit 12d. External address bits are temporally stored in the address buffer unit 12a, and the address buffer unit 12a produces row and column address predecoded signals from the external address bits. The row address predecoded signals and the column address predecoded signals are distributed to the row address decoder/word line driver unit 12b as well as to the column address decoder unit 12c.

Row addresses are respectively assigned to the rows of memory cells M11 to Mmn and, accordingly, to the word lines WL1 to WLm and the row address decoder/word line driver unit 12b responsive to the row address predecoded signals for driving one of the word lines WL1 to WLm to a positive power voltage level Vcc. Then, the n-channel enhancement type switching transistors Qn10 of the selected row concurrently turn on, and the storage capacitors SC10 of the selected row are conducted to the associated digit lines for producing potential differences.

The column address decoder unit 12c is responsive to the column address predecoded signals, and causes the column select unit 12d to couple one of the sense amplifier circuits SA1 to SAn with a data bus BUS. Then, the potential difference is relayed between one of the sense amplifier circuits SA1 to SAn and the data bus BUS, and a potential difference indicative of either input or output data bit is supplied from the input/output data buffer unit 13 to the data bus BUS or from the data bus BUS to the input/output data buffer unit 13.

The precharging system 14 comprises a plurality pairs of n-channel type charging transistors Qn11 and Qn12 coupled with the digit line pairs DL1a/DL1b to DLna/DLnb, a plurality of n-channel enhancement type balancing transistors Qn13 respectively coupled between the digit lines DL1a and DL1b to DLna and DLnb, the common voltage line 14a, an intermediate voltage generator 14b coupled at the output node N1 thereof with the common voltage line 14a and an n-channel enhancement type switching transistor Qn14 coupled between the common voltage line 14a and the source nodes of the n-channel enhancement type charging transistors Qn11 and Qn12. The source nodes of the n-channel enhancement type charging transistors Qn12 are labeled with N2. As described hereinbefore, the common voltage line 14a is coupled with the counter electrodes N3 of the storage capacitors SC10. The intermediate voltage generator 14b produces an intermediate voltage Vcc/2 from the positive power voltage Vcc, and the intermediate voltage level Vcc/2 is regulated to the mid point between the positive power voltage Vcc and the ground voltage.

The timing controlling unit 15 has a plurality of timing controlling stages sequentially producing timing control signals, and the timing control signals control at least a write-in sequence and a read-out sequence. FIG. 3 only illustrates two timing generating stages 15a and 15b, and the timing stages 15a and 15b produces a cut-off controlling signal CLk and a precharge controlling signal CLp, respectively. The precharge controlling signal CLp is supplied the gate electrodes of the n-channel enhancement type charging transistors Qn11 and Qn12 as well as to the gate electrodes of the n-channel enhancement type balancing transistors Qn13, and the cut-off controlling signal CLk is supplied to the gate electrode of the n-channel enhancement type switching transistor Qn14.

Figure 4:
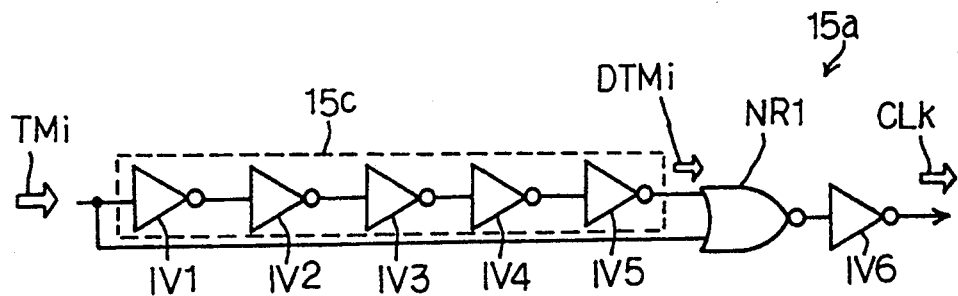
FIG. 4 is a circuit diagram showing a timing controller incorporated in the dynamic random access memory device.

FIG. 4 illustrates the timing generating stage 15a, and the timing generating stage 15a comprises a delay circuit 15c implemented by a series combination of inverters IV1 to IV5, a NOR gate NR1 and an inverter IV6. An internal trigger signal TMi is supplied to the inverter IV1, and the inverters IV1 to IV5 introduce time delay into propagation of the internal trigger signal TMi for producing a delayed signal DTMi complementary to the trigger signal TMi. The internal trigger signal TMi is directly supplied to the NOR gate NR1, and the NOR gate NR1 is enabled with the internal trigger signal TMi of the ground voltage level. However, the delay circuit 15c keeps the delayed signal DTMi in the ground voltage level for a predetermined time period, and the NOR gate NR1 shifts the output node thereof to the power voltage level Vcc, and the inverter IV6 produces the cut-off controlling signal CLk of active ground voltage level GND. When the delayed signal DTMi of the power voltage level Vcc reaches the NOR gate NR1, the NOR gate NR1 shifts the output node thereof to the ground voltage level, and the inverter IV6 changes the cutoff controlling signal CLk to the inactive power voltage level.

The timing generating unit 15 is initialized or reset with a row address strobe signal RAS recovered to an inactive high voltage level, and sequentially producing the timing control signals upon entry into a new write-in sequence or into a new read-out sequence. The write-in sequence and the read-out sequence are similar to those of a standard dynamic random access memory device except for a precharging stage of the write-in and read-out sequences, and description is focused upon the precharging stage for the sake of simplicity.

Figure 5:
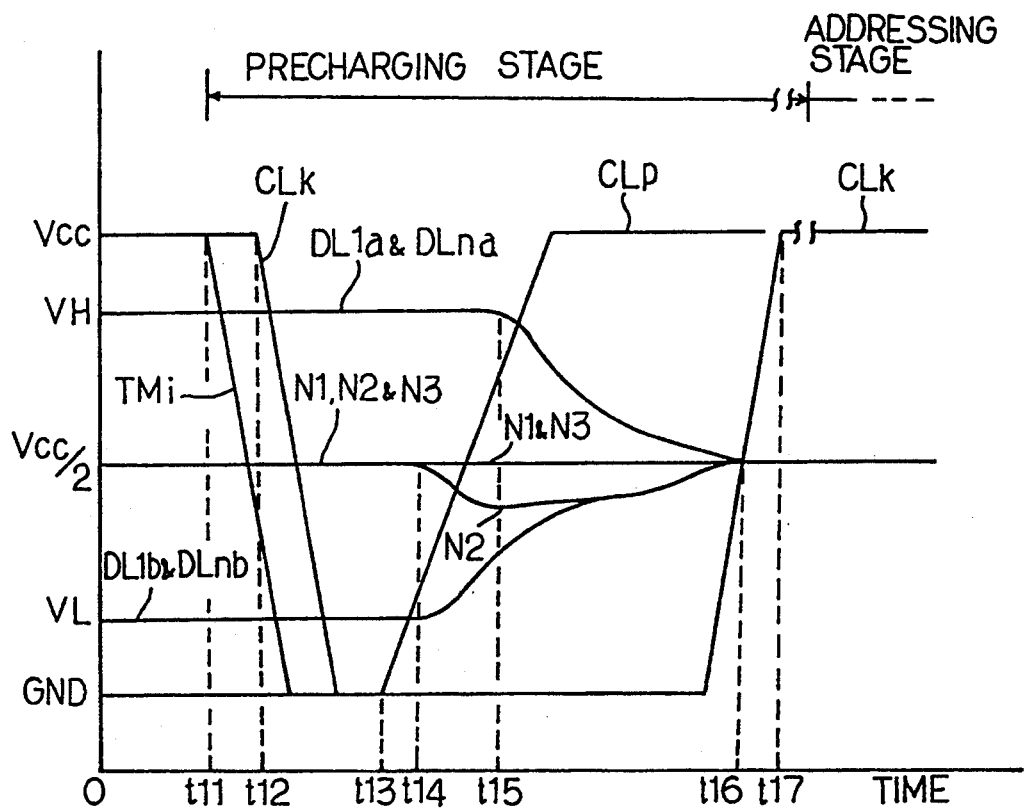
FIG. 5 is a diagram showing the waveforms on digit lines, an intermediate voltage line and counter electrodes of storage capacitors incorporated in the dynamic random access memory device.

Description is hereinbelow made on the precharging stage with reference to FIG. 5 of the drawings. Upon completion of the previous write-in or read-out cycle, the digit lines DL1a and DLna were charged to the high voltage level VH, and the digit lines DL1b and DLnb were decayed to the low voltage level VL. Assuming now that the row address strobe signal RAS is recovered to the high voltage level for resetting the timing controlling unit 15 and that a new read-out or write-in cycle immediately starts thereafter, the internal trigger signal TMi starts decaying toward the voltage level at time t11, and the cutoff controlling signal CLk follows the internal trigger signal TMi at time t12. As a result, the n-channel enhancement type switching transistor Qn14 turns off, and the common voltage line 14a and, accordingly, the counter electrodes N3 are electrically isolated from the n-channel enhancement type charging transistors Qn11 and Qn12.

The timing generating stage 15b lifts the precharge controlling signal CLp toward the power voltage level Vcc at time t13. Then, the n-channel enhancement type charging transistors Qn12 and the n-channel enhancement type balancing transistors Qn13 firstly turn on at time t14, and the n-channel enhancement type charging transistors Qn11 turn on at time t15, because the low voltage level VL on the digit line DL1b and DLnb allows the n-channel enhancement type charging transistors Qn12 and the n-channel enhancement type balancing transistors Qn13 to exceed the threshold level earlier than the n-channel enhancement type charging transistors Qn11. The source nodes N2 are pulled down. However, the output node N1 and the counter electrodes N3 are kept at the intermediate voltage Vcc/2 by virtue of the n-channel enhancement type switching transistor Qn14. Therefore, no data destruction takes place in the storage capacitors SC10, and it is not necessary for the intermediate voltage generator 14b to supply current the counter electrodes N3. This means that the electric power consumption is decreased.

After the n-channel enhancement type charging transistors Qn11 turn on, the source nodes N2 are recovered toward the intermediate voltage level Vcc/2, and reach the intermediate voltage level Vcc/2 at time t16.

If the determined time period is expired at time t17, the cut-of controlling signal CLk is changed to the inactive power voltage level Vcc, and the common voltage line 14a and, accordingly, the intermediate voltage generator 14b are conducted with the source nodes N2.

When the recharging stage is completed, the addressing system 12 starts to select a memory cell from the array 11, and an addressing stage follows the precharging stage.

As will be appreciated from the foregoing description, the dynamic random access memory device according to the present invention is newly equipped with the n-channel enhancement type switching transistor Qn14 for electrically isolating the common voltage line 14a from the charging transistors Qn11 and Qn12, and the n-channel enhancement type switching transistor Qn14 prevents the common voltage line 14a and the intermediate voltage generator 14b from voltage fluctuation at the drain nodes N2. As a result, the counter electrodes N3 are maintained at the intermediate voltage level Vcc/2 at all times, and no data destruction occurs in the precharging stage.

Although the particular embodiment of the present invention has been shown and described, it will be obvious to those skilled in the art that various changes and modifications may be made without departing from the spirit and scope of the present invention. For example, the dynamic random access memory device according to the present invention may be integrated on a single semiconductor chip together with other component function blocks, and the intermediate voltage level may not be strictly adjusted to the mid point between the power voltage level and the ground voltage level.

What is claimed is:

1. A dynamic random access memory device comprising:
   a) a plurality of memory cells respectively storing data bits in the form of electric charges, each of said memory cells comprising a first switching transistor and a storage capacitor coupled in series, said storage capacitor having an accumulating electrode coupled with a source node of said first switching transistor and a counter electrode opposed to said accumulating electrode;
   b) an addressing system responsive to external address bits for allowing said plurality of memory cells to selectively become accessible;
   c) a plurality of digit lines selectively coupled with a drain node of said first switching transistor of each of said memory cells, and forming digit line pairs for propagating data bits in the form of a potential difference;
   d) an intermediate voltage generator for generating an intermediate voltage having a level between a high voltage level and a low voltage level, and for supplying said intermediate voltage via a common voltage line to said counter electrode of each storage capacitor;
   e) a precharging unit, coupled to said plurality of digit lines, said precharging unit simultaneously coupling said plurality of digit lines to a common node in a precharging stage, before said addressing system allows said plurality of memory cells to selectively become accessible, to balancing said plurality of digit lines with one another; and
   f) a cut-off means, coupled between said common voltage line and said common node, for electrically isolating said common voltage line from said precharging unit during said precharging stage to prevent voltage fluctuation at said counter electrode of each said storage capacitor during said precharging stage.

2. The dynamic random access memory device as set forth in claim 1, wherein said precharging unit comprises a plurality of precharging transistors respectively coupled to said plurality of digit lines, and wherein said cut-off means comprises a second switching transistor having a source-to-drain path coupled between said common voltage line and source nodes of said plurality of precharging transistors, and a timing generating stage, coupled to a gate electrode of said second switching transistor, which controls said second switching transistor to turn off for preventing voltage fluctuation at said counter electrode of said storage capacitor of each of said memory cells during said precharging stage.

3. The dynamic random access memory device as set forth in claim 2, wherein said timing generating stage controls said second switching transistor to turn off before said plurality of precharging transistors turn on, said timing generating stage controlling said second switching transistor to turn on after said plurality of said digit lines are balanced.

4. The dynamic random access memory device as set forth in claim 2, wherein said timing generating stage comprises a delay means for introducing time delay into propagation of a timing signal, and a NOR gate having a first input node coupled with an output node of said delay means and a second input node coupled with an input node to which said timing signal is applied.

5. The dynamic random access memory device as set forth in claim 4, wherein said delay means comprises a series combination of inverters.

6. A dynamic random access memory device comprising:
   a digit line pair;
   a memory cell, coupled with one of digit lines of said digit line pair, having a capacitor with an electrode coupled with a common line;
   a means for supplying a precharging voltage level to said common line;
   a means for balancing said digit lines of said digit line pair with one another; and
   a means for coupling said digit line pair with said common line after the digit lines of said digit line pair are balanced.

* * * * *

UNITED STATES PATENT AND TRADEMARK OFFICE
CERTIFICATE OF CORRECTION

PATENT NO.    : 5,404,325
DATED         : April 4, 1995
INVENTOR(S)   : Kazuo Shibata It is certified that error(s) appears in the above-identified patent and that said Letters Patent is hereby corrected as shown below:

Column 1, Line 49, delete "r" and insert --or--.

Column 6, Line 54, delete "recharging" and insert --precharging--.

Signed and Sealed this

Twenty-second Day of August, 1995

Attest:

BRUCE LEHMAN

*Attesting Officer*    *Commissioner of Patents and Trademarks*